(12) United States Patent
Paul et al.

(10) Patent No.: US 10,200,051 B2
(45) Date of Patent: *Feb. 5, 2019

(54) ANALOG-TO-DIGITAL CONVERTER WITH AN INCREASED RESOLUTION FIRST STAGE

(71) Applicant: TEXAS INSTRUMENTS INCORPORATED, Dallas, TX (US)

(72) Inventors: Sabu Paul, Kerala (IN); Raghu Nandan Srinivasa, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/676,581

(22) Filed: Aug. 14, 2017

(65) Prior Publication Data

US 2018/0191361 A1 Jul. 5, 2018

Related U.S. Application Data

(63) Continuation of application No. 15/395,285, filed on Dec. 30, 2016, now Pat. No. 9,735,794.

(51) Int. Cl.
*H03M 1/00* (2006.01)
*H03M 1/06* (2006.01)
*H03M 1/16* (2006.01)

(52) U.S. Cl.
CPC .......... *H03M 1/001* (2013.01); *H03M 1/002* (2013.01); *H03M 1/0607* (2013.01); *H03M 1/164* (2013.01)

(58) Field of Classification Search
CPC ........ H03M 1/001; H03M 1/002; H03M 1/66; H03M 1/747; H03M 1/12; H03M 1/802; H03M 1/804; H03M 1/806
(Continued)

(56) References Cited

U.S. PATENT DOCUMENTS

| | | | |
|---|---|---|---|
| 5,638,071 | A | 6/1997 | Capofreddi et al. |
| 7,612,700 | B2 | 11/2009 | Kawahito et al. |

(Continued)

OTHER PUBLICATIONS

Prosecution History for U.S. Appl. No. 15/395,285 from Dec. 30, 2016 to Jul. 27, 2017 (76 pages).

*Primary Examiner* — Jean B Jeanglaude
(74) *Attorney, Agent, or Firm* — John R. Pessetto; Charles A. Brill; Frank D. Cimino

(57) ABSTRACT

One example includes a pipelined analog-to-digital converter device. The pipelined analog-to-digital converter device includes a capacitive digital-to-analog converter, a first analog-to-digital converter, and a second analog-to-digital converter. The capacitive digital-to-analog converter includes a capacitor comprised of a top plate and a bottom plate, the capacitive digital-to-analog converter sampling an analog input signal applied to the pipelined analog-to-digital converter device while the capacitor is grounded, holding the sampled analog input while the top plate is floated, and outputting a residue voltage. The second analog-to-digital converter is coupled to the top plate of the capacitor, the second analog-to-digital converter producing a second digital representation of voltage on the top plate of the capacitor after the top plate is floated, wherein the second digital representation represents fine bits produced by the first stage of the pipelined analog-to-digital converter device.

10 Claims, 4 Drawing Sheets

(58) Field of Classification Search
USPC .................. 341/172, 118, 155, 161, 110
See application file for complete search history.

(56) References Cited

U.S. PATENT DOCUMENTS

| | | |
|---|---|---|
| 8,497,790 B1 | 7/2013 | Lewis et al. |
| 8,659,461 B1 | 2/2014 | Zhu et al. |
| 9,503,116 B2 * | 11/2016 | Speir .................. H03M 1/1019 |
| 2003/0006926 A1 | 1/2003 | Nikai et al. |
| 2004/0036453 A1 * | 2/2004 | Rossi .................. H03F 3/005 |
| | | 323/242 |
| 2008/0211706 A1 | 9/2008 | Sutardja |
| 2010/0142653 A1 | 6/2010 | Furuta et al. |
| 2011/0199244 A1 | 8/2011 | Erdmann et al. |
| 2013/0141260 A1 | 6/2013 | Lai et al. |
| 2013/0214944 A1 | 8/2013 | Kosic |
| 2014/0184434 A1 | 7/2014 | Chen |

\* cited by examiner

ANALOG-TO-DIGITAL CONVERTER WITH AN INCREASED RESOLUTION FIRST STAGE

CROSS-REFERENCE TO RELATED APPLICATIONS

This application is a continuation of U.S. patent application Ser. No. 15/395,285, filed Dec. 30, 2016, which is incorporated herein by reference in its entirety.

TECHNICAL FIELD

This disclosure relates generally to an analog-to-digital converter, and more specifically to an analog-to-digital converter with an increased resolution first stage.

BACKGROUND

In electronics, an analog-to-digital converter (ADC) is a device that converts an analog signal into a digital signal. For example, an ADC may convert an analog audio signal picked up by a microphone into a digital signal, such as from microphones in a recording studio which allows the digital signal to be manipulated with a computer. An ADC may also provide an isolated measurement such as an electronic device that converts an input analog voltage or current to a digital number proportional to the magnitude of the voltage or current. The digital output is typically a two's complement binary number that is proportional to the input.

SUMMARY

One example includes a pipelined analog-to-digital converter device. The pipelined analog-to-digital converter device includes a first stage that is comprised of a capacitive digital-to-analog converter, a first analog-to-digital converter, and a second analog-to-digital converter. The capacitive digital-to-analog converter includes a capacitor comprised of a top plate and a bottom plate. The capacitive digital-to-analog converter samples an analog input signal applied to the pipelined analog-to-digital converter device while the capacitor is grounded, holding the sampled analog input while the top plate is floated, and outputting a residue voltage. The first analog-to-digital converter is coupled to the bottom plate of the capacitor, the first analog-to-digital converter producing a first digital representation of voltage on the bottom plate of the capacitor while the capacitor is grounded, wherein the first digital representation represents course bits produced by the first stage of the pipelined analog-to-digital converter device. The second analog-to-digital converter is coupled to the top plate of the capacitor. The second analog-to-digital converter produces a second digital representation of voltage on the top plate of the capacitor after the top plate is floated, wherein the second digital representation represents fine bits produced by the first stage of the pipelined analog-to-digital converter device.

Another example includes a method of converting an analog signal to a digital signal, comprising sampling an analog input signal applied to a pipelined analog-to-digital converter device while a top plate of a capacitor of a capacitive digital-to-analog converter is grounded; converting a voltage on a bottom plate of the capacitor into a first digital representation, wherein the first digital representation represents course bits produced by a first stage of the pipelined analog-to-digital converter device; floating the top plate of the capacitor; and converting a voltage on the top plate of the capacitor into a second digital representation, wherein the second digital representation represents fine bits produced by the first stage of the pipelined analog-to-digital converter device.

Another example includes another pipelined analog-to-digital converter device. The pipelined analog-to-digital converter device is comprised of a first stage and a second stage. The first stage is comprised of a capacitive digital-to-analog converter, a first analog-to-digital converter, and a second analog-to-digital converter. The capacitive digital-to-analog converter includes a capacitor comprised of a top plate and a bottom plate, the capacitive digital-to-analog converter sampling an analog input signal applied to the pipelined analog-to-digital converter device while the capacitor is grounded and holding the sampled analog input while the top plate is floated. The first analog-to-digital converter is coupled to the bottom plate of the capacitor, the first analog-to-digital converter producing a first digital representation of voltage on the bottom plate of the capacitor while the capacitor is grounded, wherein the first digital representation represents course bits produced by the first stage of the pipelined analog-to-digital converter device. The second analog-to-digital converter is coupled to the top plate of the capacitor, the second analog-to-digital converter producing a second digital representation of voltage on the top plate of the capacitor after the top plate is floated, wherein the second digital representation represents fine bits produced by the first stage of the pipelined analog-to-digital converter device. The third analog-to-digital converter is coupled to an analog output of the capacitive digital-to-analog converter, the third analog-to-digital converter producing a third digital representation of a residue voltage from the first stage. The digital summer sums the first, second, and third digital representations into a composite digital representation of the analog signal applied to the pipelined analog-to-digital converter device.

DETAILED DESCRIPTION

This disclosure relates to a pipeline analog-to-digital converter (ADC) that is able to obtain additional bits out of a first stage of a plurality of stages. In one example, the first stage of the ADC includes a capacitive digital-to-analog converter (CDAC) that is comprised of a capacitor. A first analog-to-digital (ADC) is coupled to a bottom plate of the capacitor and a second ADC is coupled to a top plate of the capacitor. The first and second ADCs in the first stage together produce more bits for the first stage than is typical with use of a single additional ADC in the first stage. A residue voltage from the first stage is converted into additional bits of resolution by a second stage. In an example, a hybrid arrangement includes use of the second analog-to-digital converter coupled to the top plate of the capacitor allows for sixty four levels across an input signal using only twenty four comparators, where typically such a resolution would require sixty-four comparators. Less comparators reduce the power requirements of the pipelined ADC.

Typically, an input connected to a first stage of a pipelined ADC has timing and bandwidth mismatch with respect to a stage one sampling network. This introduces dynamic errors that limit an effective number of bits for the first stage to four at high input frequencies. The ADC disclosed herein includes a hold phase that eliminates such dynamic errors. Moreover, by adding the second analog-to-digital converter within the first stage of the ADC coupled to the top plate of the capacitor, additional bits are obtained with the first stage of the ADC that allows for relaxed specs for the second stage.

Figure 1:
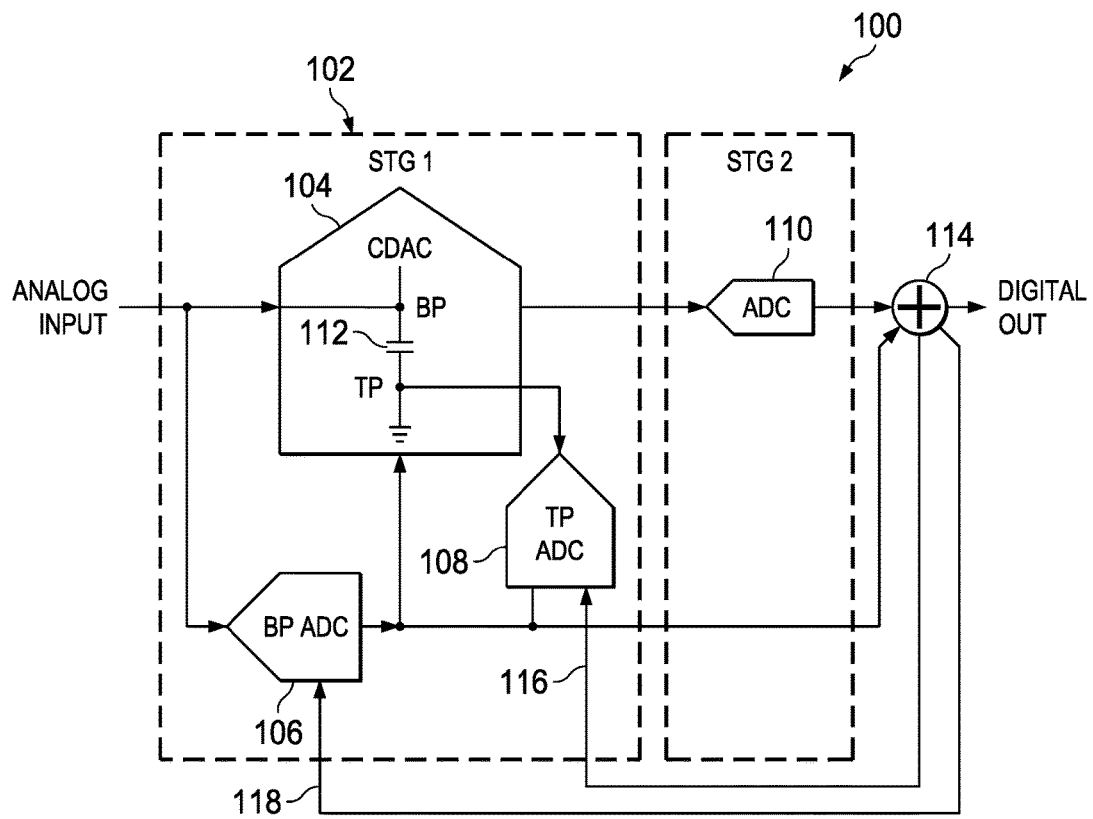
FIG. 1 illustrates an example of a device to obtain additional bits from a first stage of the device.

FIG. 1 illustrates an example of a device 100 to obtain additional bits from a first stage of the device 100. In an example, the device 100 is a pipelined ADC. In other examples, the device 100 is a component within another device, such as audio recording equipment. The device 100 includes a first stage, STG 1, and a second stage, STG 2. However, the device 100 could include one or more additional stages based on a desired device resolution.

STG 1 includes a capacitive digital-to-analog converter (CDAC) 104 that is coupled to an analog input providing an analog input signal, ANALOG INPUT to the device 100. The CDAC 104 includes a capacitor 112. The capacitor 112 includes a bottom plate (BP) and a top plate (TP). The CDAC 104 accepts the ANALOG INPUT for a sampling time period in which the capacitor 112 is coupled to a ground. Thereafter, the TP of the capacitor 112 is floated and goes to a voltage: −Vin (e.g., ANALOG INPUT)+VDAC during a subtract time period. After the voltage is subtracted, the remaining voltage on the capacitor 112 is held. Such holding of the voltage across the capacitor 112 eliminates dynamic errors. Thus, the CDAC 104 acts like a sample/subtract/hold circuit. The CDAC 104 includes a capacitor array (FIG. 4) to generate a charge residue, this residue being proportional to a difference between an N-level signal approximation and the signal itself. This charge residue is dumped on a virtual ground of an amplifier (FIG. 4) within the CDAC 104. The CDAC 104 subtracts the DAC voltage from the input voltage and generates a charge input that is proportional to a residue voltage on the TP of the capacitor 112. The CDAC 104 produces an analog voltage representation of this residue, which is smaller in magnitude than produced in a conventional STG 1. In an example, the CDAC 104 is used in low to medium speed, low-noise, high-linearity applications.

The BP of the capacitor 112 of the CDAC 104 is coupled to a first analog-to-digital converter (ADC) within STG 1, referenced herein as BP ADC 106. During the hold time period at which the capacitor 112 is coupled to a ground, the BP ADC 106 accepts the voltage that is on the BP of the capacitor 112. The BP ADC 106 produces a small number of bits that correspond to the course bits produced by the STG 1 during the hold time period. In an example, the BP ADC 106 produces up to four bits. In other examples, the BP ADC 106 produces more or less bits. The BP ADC 106 may introduce offset errors that are addressed with the circuit shown in FIG. 3.

The TP of the capacitor 112 of the CDAC 104 is coupled to a second ADC within STG 1, referenced herein as TP ADC 108. After the BP ADC 106 produces its bits, the TP of the capacitor 112 is floated. After the TP of the capacitor 112 is floated, the output of the BP ADC 106 is coupled to the BP of the capacitor 112. The TP then moves to ANALOG INPUT minus VDAC(BP). The VDAC(BP) is an intermediate voltage that corresponds to the first approximation of the STG 1 output produced by the BP ADC 106. Thereafter, during the hold time period in which the TP of the capacitor 112 is floated, TP ADC 108 accepts the voltage that remains on the TP of the capacitor 112 after the capacitor 112 is floated. The TP ADC 108 output determines the CDAC 104 voltage that will be subtracted from the ANALOG INPUT together with the BP ADC 106. The TP ADC 108 produces a small number of bits that correspond to the fine bits produced by the STG 1 during the hold time period. Then, the output of the TP ADC 108 is coupled to the BP of the capacitor 112. After such a coupling, the TP moves to ANALOG INPUT minus VDAC (BP+TP), which is the final unamplified residue of STG1. In an example, the TP ADC 106 produces two bits, two more bits than are conventionally available from the STG 1. In other examples, the TP ADC 108 produces more or less bits. Thus, in the example STG 1 produces six bits of resolution, two additional bits of resolution than is possible with a conventional STG 1 that lacks the TP ADC 108. To avoid corrupting the voltage that remains on the TP of the capacitor 112, the TP ADC 108 may be small relative to the BP ADC 106. Such a small TP ADC 108 may introduce offset errors that are addressed with the circuit shown in FIG. 3. The TP ADC 108 includes a tight specification on charge leakage and input load. In an example, the BP ADC 106 and the TP ADC 108 include the circuit shown in FIG. 3 to correct for offset errors.

STG 2 includes a third ADC 110. The ADC 110 is coupled to the output of the CDAC 104. The ADC 110 in the STG 2 receives the analog voltage produced by the CDAC 104. This analog voltage represents the residue voltage of the CDAC 104.

A digital summer 114 is coupled to the output of the BP ADC 106, the output of the TP ADC 108, and the output of the ADC 110. The digital summer 114 combines the bits produced by the STG 1 with the bits produced by the STG 2, the bits produced by the BP ADC 106, the TP ADC 108, and the ADC 110, to produce a composite digital output signal, DIGITAL OUT. The DIGITAL OUT is a digital representation of ANALOG INPUT of the device 100.

The digital summer 114 is additionally coupled to error feedback loops, a first error feedback loop 116 coupled to the TP ADC 108 and a second error feedback loop 118 coupled to the BP ADC 106. STG2 output is used to adjust TP ADC 108 levels and TP ADC 108 is used to adjust BP ADC 106 levels. The digital summer 114 additionally checks the STG 2 output. If the STG 2 output is outside a range in which it is expected to be within given an ideal TP ADC 108 and BP ADC 106, this provides an indication of offset errors. These offset errors provide an indication that the thresholds of the TP ADC 108 and the BP ADC 106 are erroneously set. The digital summer 114 continuously monitors a direction in which the over-range is occurring, higher than a MAX value or lower than a MIN value, and the output of the TP ADC 108 and the BP ADC 106 as a basis for adjusting the thresholds of the TP ADC 108 and the BP ADC 106, discussed in more detail in FIG. 3. The digital summer 114 provides an error correction signal to the TP ADC 108 and the BP ADC 106 via the error feedback loops 116 and 118, respectively. In an example, the TP ADC 108 and the BP ADC 106 correct for such offset errors based on the error correction signal received from the digital summer 114.

Figure 2:
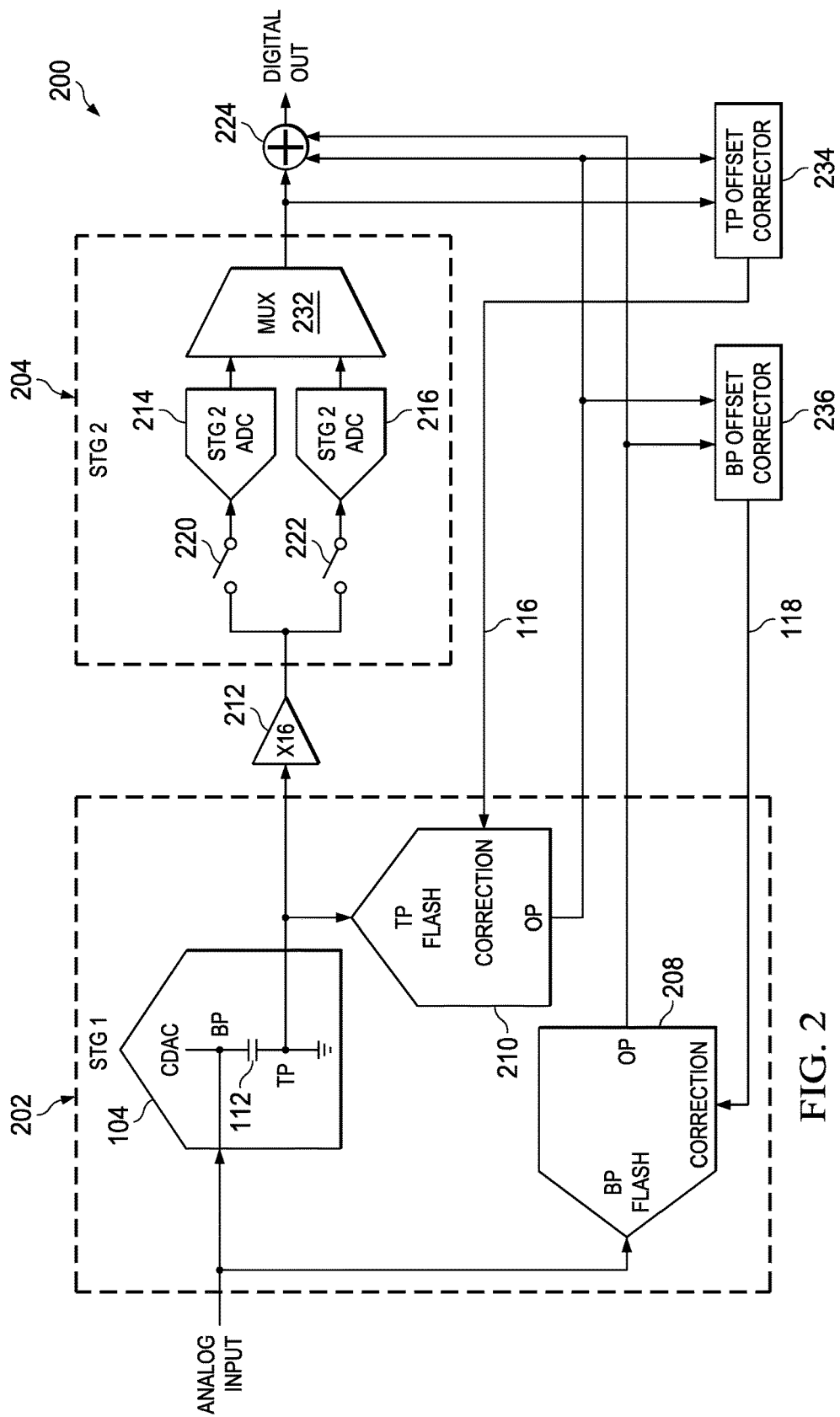
FIG. 2 illustrates an example of another device to obtain additional bits from a first stage of the device.

FIG. 2 illustrates an example of another device 200 to obtain additional bits from a first stage of the device 200. In an example, the device 200 is a pipelined ADC. In other examples, the device 200 is a component within another device, such audio recording equipment.

In the example device 200, STG 1 specifically includes a flash ADC that is coupled to the BP of the capacitor 112, referenced herein as BP flash 208. STG 1 further includes a flash ADC that is coupled to the TP of the capacitor 112, referenced herein as TP flash 210. The BP flash 208 performs the functionality described above for BP ADC 106 and the TP flash 210 performs the functionality described above for the TP ADC 108. In addition to the advantages described above for the BP ADC 106 and the TP ADC 108, the BP flash 208 and the TP flash 210 include the circuitry shown in FIG. 3.

In addition to the advantages described above for the BP ADC 106 and the TP ADC 108, in an example the BP flash 208 and the TP flash 210 are each coupled to offset correctors, for example BP offset corrector 236 and TP offset corrector 234. The BP offset corrector 236 receives an output from both the TP flash 210 and the BP flash 208. Based on the received output of both the TP flash 210 and the BP flash 208, the BP offset corrector 236 produces an offset correction signal. The BP offset corrector 236 outputs such an offset correction signal to the BP flash 208 to correct for offset errors produced by the BP flash 208. The TP offset corrector 234 receives an output from both the TP flash 210 and an output of a multiplexer 232. Based on the received output of both the TP flash 210 and the output of the multiplexer 232, the TP offset corrector 234 produces an offset correction signal. The TP offset corrector 234 outputs such an offset correction signal to the TP flash 210 to correct for offset errors produced by the TP flash 210.

The device 200 further includes an amplifier 212 coupled to the output of the CDAC 206 and coupled to an input of the STG 2 of the device 200. In the example shown, the amplifier 212 is coupled to a plurality of ADC, for example, an input of a first ADC 214 and an input of a second ADC 216. The amplifier 212 amplifies the analog signal produced by the CDAC 206 and outputs the amplified analog signal to STG 2. The analog signal produced by the CDAC 206 is a smaller residue than is conventionally provided by the STG 1, which allows the AMP 212 to use a higher gain than is used between a conventional STG 1 and STG 2. Use of such a higher gain reduces impact of STG 2 non-idealities.

STG 2 includes the first ADC 214 and the second ADC 216 in parallel, with their outputs coupled to first and second inputs of the multiplexer 232. The multiplexer 232 multiplexes such inputs and outputs the multiplexed signal to the digital summer 224. In another example, STG 2 includes a single ADC coupled to the digital summer 224. In an example, the first and second ADCs 214 and 216 are interleaved successive approximation registers (SAR) ADCs. SAR ADCs provide a benefit of having no offset errors and high accuracy. The two ADCs 214 and 216 operate in parallel, and thus speed processing of the analog signal introduced to STG 2. This increased speed allows for the timing output of STG 2 to approximately match the output of STG 1. A first switch 220 is coupled to the output of the amplifier 212 and the input of the first ADC 214 and a second switch 222 is coupled to the output of the amplifier 212 and the input of the second ADC 216. The first and second switches 220 and 222 are close at an appropriate time to allow the first and second ADCs 214 and 216 to input an analog voltage signal from the amplifier 212. Thereafter, the first and second ADCs 214 and 216 produce digital representations of respective portions of the analog voltage signal produced by the amplifier 212. These digital representations are output to the multiplexer 232.

A digital summer 224 is coupled to the output of the BP flash 208, the output of the TP flash 210, and the output of the multiplexer 232. The digital summer 114 combines the bits produced by the STG 1 with the bits produced by the STG 2, the bits produced by the BP flash 208, the TP flash 210, the ADC 214, and the ADC 216, to produce a composite digital output signal, DIGITAL OUT. The DIGITAL OUT is a digital representation of ANALOG INPUT of the device 200.

In an example, the BP flash 208 is a 16-level ADC and the TP flash 210 is an 8-level ADC with 4 redundant levels. Further, the STG2 includes 2048 levels, with 1024 redundant levels. The output of the BP flash 208 is equal to a number of 1's in the output of the BP flash 208 (bp_op) minus 8, with a maximum output of +8 and minimum output of −8 for a 16-level flash. The output of the TP flash 210 (tp_op) is equal to a number of 1's in the output of the TP flash 210 minus 4, with a maximum output of +4 and minimum output of −4. The output of the STG 2 (stg2_op) is equal to a signed output of the STG2. The final output of the digital summer 224 is equal to bp_op* 2^12+ tp_op*2^10+stg2_op.

Figure 3:
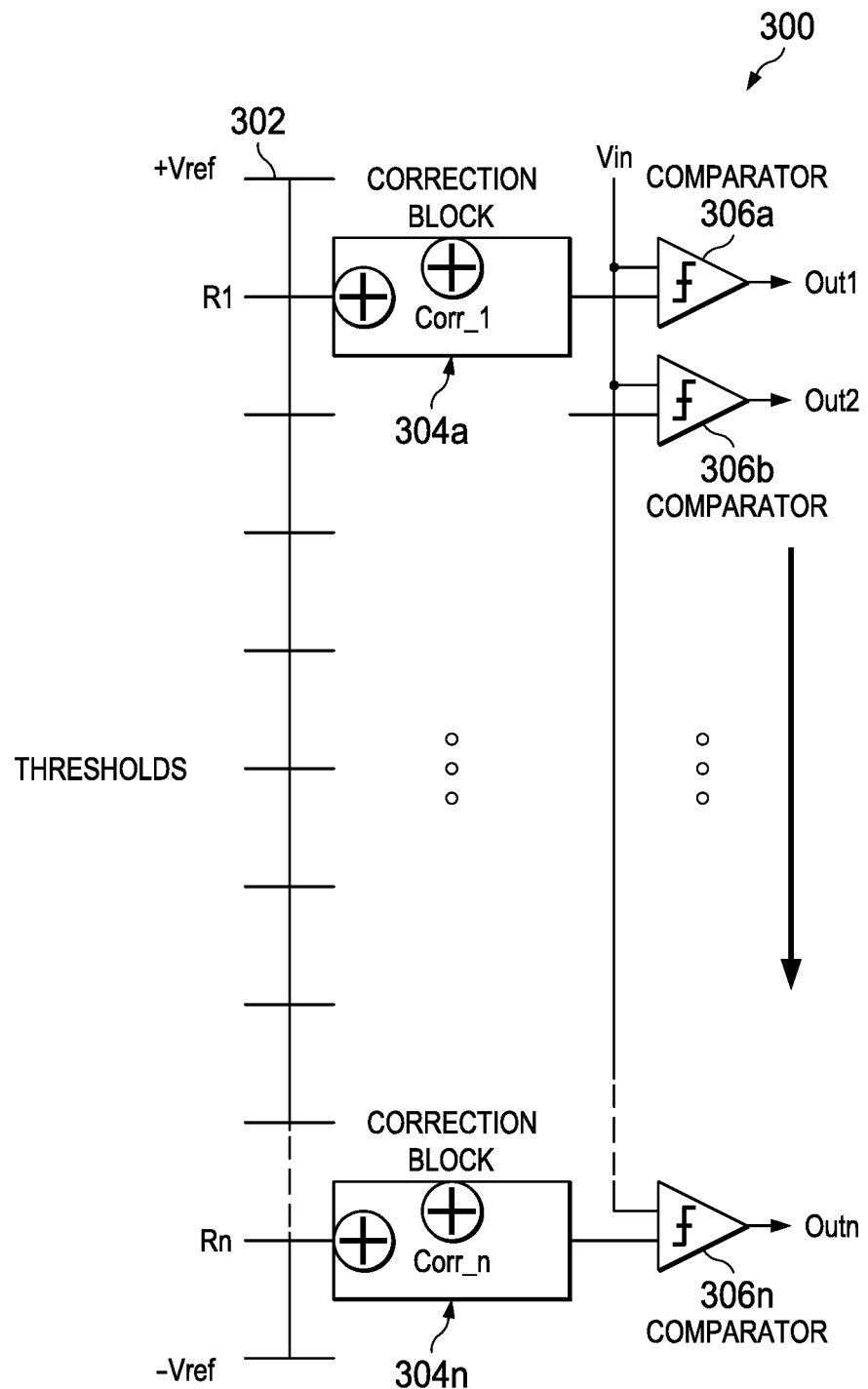
FIG. 3 illustrates an example of an offset correction circuit that corrects for offset errors.

FIG. 3 illustrates an example of circuit 300 that corrects for offset errors. In an example, the TP ADC 108, the BP ADC 106, the TP flash 210, and the BP flash 208 each include the circuit 300. In an example, the circuit 300 corrects for offset errors that are a result of thresholds of the TP ADC 108, the BP ADC 106, the TP flash 210, and the BP flash 208 being erroneously set. In another example, the circuit 300 corrects for offset drifts that are a result of temperature and other device parameters. In a pipelined device, such as device 100/200, each following stage includes additional input range to correct for ADC errors of a preceding stage. This additional range is equal to the required range of the device 100/200. This is referred to herein as over-range or error correction range. The output of STG1 and STG2 are monitored and if either exceeds its normal range, or over-range, a preceding stage ADC has made an error, which includes the BP ADC 106, TP ADC 108, BP flash 208, and TP flash 210. By monitoring a direction of the over-range, a determination can be made as to a direction of the offset. The circuit 300 corrects for such offsets. STG2 output is used to adjust TP ADC 108 levels and TP ADC 108 is used to adjust BP ADC 106 levels.

The TP ADC 108, TP flash 210, BP ADC 106, and BP flash 208 may each include the circuit 300 to correct for offset errors. The circuit 300 includes a linear voltage ladder 302 that includes a plurality of resistors R1-Rn. The top of the linear voltage ladder 302 is coupled to voltage +Vref and the bottom of the resistor ladder is coupled to voltage −ref. The resistors R1-Rn are coupled to correction blocks 304a-304n, respectively. The correction blocks 304a-304n are coupled to comparators 306a-306n, respectively. The comparators 306a-306n are additionally coupled to voltage Vin. The comparators 306a-306n produce individual bits Out1-Outn, respectively.

The circuit 300 accounts for variables. For example, the outputs Out1-Outn of each comparators 306a-306n indicates whether the input is greater or lesser than a voltage threshold value that is established for a particular comparator 306. The correction value Corr_1-Corr_n for thresholds of each of the comparators 306a-306n ranges from 1to n. The digital output from STG 2 corresponds to the analog voltage output of STG1−(Vin−VDAC_BP−VDAC_TP), where VDAC_BP is the analog voltage corresponding to the output of the STG 1 BP flash 208 and VDAC_TP is the analog voltage corresponding to the digital output of the STG 1 BP ADC 106/BP flash 208. Thus, the output the circuit 300 increases with increasing input voltage and decreases with increasing output from STG 1 TP ADC 108/TP flash 210 and BP ADC 106/BP flash 208.

The circuit 300 executes an algorithm. For example, the digital summer 114/TP offset corrector 234 determines whether the output of STG 2 is greater than a maximum threshold value MAX_VALUE. If the digital summer 114/TP offset corrector 234 determines that the output of STG 2 is greater than the maximum threshold value MAX_VALUE, a further determination is made of which comparator 306a-306n is producing a binary 0 Out from Out1 to Outn. Whichever correction block 304 is coupled to that comparator 306, the correction block 304 modifies the output of the comparator 306 to instead output a binary 1 Out instead.

Thus, if the output of STG 1 is greater than the maximum allowed value, it means that the number of comparators 306 in the circuit 300 that gave an output of binary 1 is less than the correct number. The digital summer 114/BP offset corrector 236/TP offset corrector 234 monitor the output of STG 1 to make such a determination. This requires an increase in the number of binary 1's in the output of the circuit 300. To execute such an increase, the thresholds of the comparators 306 are lowered. Knowing a direction in which the thresholds are to be moved, a determination is made as to which comparator 306 requires adjustment. The comparator 306 with the lowest threshold that produces an output of binary 0 is selected. This comparator 306 is adjusted to give an output of binary 1 for the given input, applying a negative correction to this comparator 306. If the digital summer 114//TP offset corrector 234 determines that the output of STG 2 is less than a minimum threshold value MIN_VALUE, a further determination is made of which comparator 306a-306n is producing a binary 1 Out from Out1 to Outn. Whichever correction block 304 is coupled to that comparator 306, the correction block 304 modifies the output of the comparator 306 to instead output a binary 1 Out instead. If the digital summer 114/TP offset corrector 234 determines that the output of STG 2 is not greater than the maximum threshold value MAX_VALUE and that the output of STG 2 is not less than the minimum threshold value MIN_VALUE, no action is taken.

The circuit 300 accounts for negative over-range, with the number of binary 1's produced by the circuit 300 being more than what it should be. This requires that the number of binary 1's in the circuit 300 output be decreased which requires thresholds of the comparators 306 be increased that give a binary 1 as its output. The comparator 306 with the highest threshold whose output is binary 1 is selected. The corresponding correction block 304 applies a positive threshold adjustment to this comparator 306 to give an output of binary 0 instead for the given input.

The circuit 300 executes this algorithm continuously until all thresholds come to correct values even in the presence of large comparator 306 offsets. The correction block 304 controlled by the offset correction signal produced by the digital summer 114/BP offset corrector 236/TP offset corrector 234 and the algorithm adjust the thresholds going to each comparator 306, respectively, to account for its offset.

Figure 4:
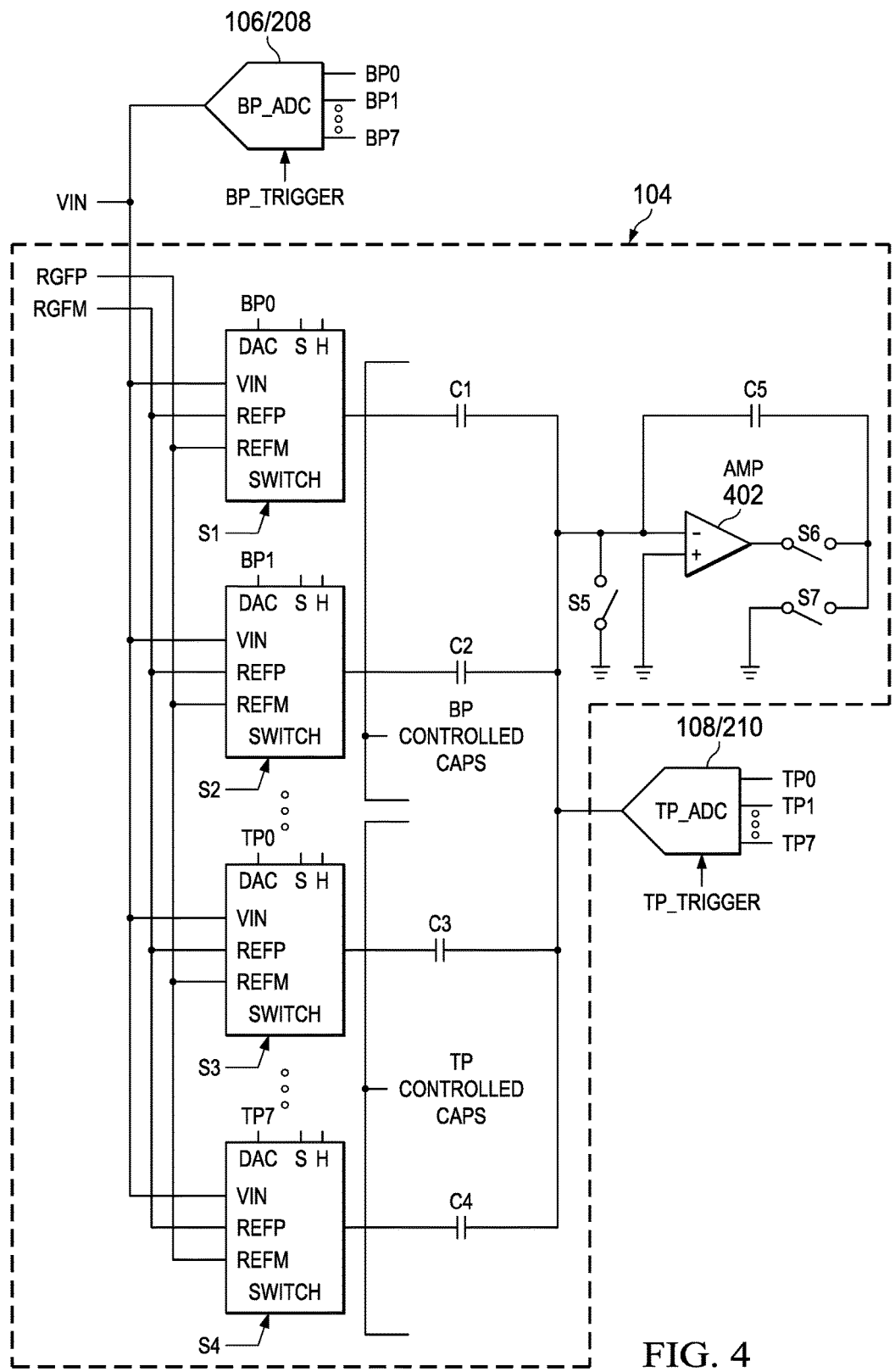
FIG. 4 illustrates an example capacitive digital-to-analog converter coupled to a top plate analog-to-digital converter and a bottom plate analog-to-digital converter.

FIG. 4 illustrates an example CDAC 104 coupled to the TP ADC 108/210 and the BP ADC 106/208. The CDAC 104 and the BP ADC 106/208 are coupled to a VIN. The BP ADC 106/208 produces a number of output bits, for example on BP0-BP7 outputs and TP ADC 108/210 produces a number of output bits, for example on TP0-TP7 outputs. The CDAC 104 is further coupled to a positive reference voltage on REFP node and a negative reference voltage on REFM node. The TP ADC 108/210 is triggered with a signal received on TP_TRIGGER signal node and the BP ADC 106/208 is triggered with a signal received on BP_TRIGGER signal node.

The CDAC 104 includes a number of switches that switch in/out a number of respective capacitors. For example, switches S1-S4 are respectively coupled to capacitors C1-C4. Only four switches S1-S4 and four respective capacitors C1-C4 are illustrated for ease of explanation, with the number of such switches and respective capacitors being based on a desired resolution of the CDAC 104. Each of these switches S1-S4 includes a VIN signal node, the REFP node, the REFM node, and a DAC node. Capacitors C1 and C2 are controlled via their respective switches S1 and S2. The DAC node of switch S1 is coupled to the BPO output of the BP ADC 106/208 and the DAC node of switch S2 is coupled to the BP1 output of the BP ADC 106/208. Thus, for an eight bit BP ADC 106/208 there are a corresponding number of switches and capacitors. Likewise, Capacitors C3 and C4 are controlled via their respective switches S3 and S4. The DAC node of switch S3 is coupled to the TPO output of the TP ADC 108/210 and the DAC node of switch S4 is coupled to the TP7 output of the TP ADC 108/210. Thus, for an eight level (3-bit) TP ADC 108/210 there are a corresponding number of switches and capacitors. The switches S1-S4 further includes, an "S" sampling timing node, and an "H" hold timing node that receive signals that control when the switches S1-S4 turn ON and OFF. The switches S1-S4 are also coupled to the BP ADC 106/208.

During the sampling time period of the CDAC 104, switches S1-S4 are closed to couple VIN to capacitors C1-C4 and switch S5 is closed to couple the ground to capacitors C1-C4. With capacitors C1-C4 grounded, the BP ADC 106/208 is triggered on BP TRIGGER node to produce its bits according to a voltage on the BP of the capacitors C1 and C2. Thereafter, switch S5 is opened to float the TP of the capacitors C1-C4, and the TP ADC 108/210 receives the voltage that remains on the TP of the capacitors C1-C4 after the capacitors C1-C4 are floated. With the TP floated, the TP ADC 108/210 is triggered on TP TRIGGER node to produce its bits according to a voltage on the TP of the capacitors C1-C4.

To generate the residue discussed above, the switches S1-S4 are selectively closed according to signals received on respective DAC nodes of the switches S1-S4. The signals received on these DAC nodes of the switches S1-S4 selectively activate the capacitors C1-C4 to produce an analog output voltage that is output to an amplifier 402. One input of the amplifier 402 is coupled to the capacitors C1-C4. A second input of the amplifier 402 is coupled to ground. An output of the amplifier 402 is coupled to a switch S6 that is coupled to a capacitor C5 which is also coupled to the first input of the amplifier 402. The switch S6 is also coupled to another switch S7 that is coupled to ground. After the TP ADC 108/210 and the BP ADC 106/208 produce their respective bits, the amplifier 402 is activated to amplify the residue that remains on the TP of the capacitors C1-C4 for STG 2 of the device 100/200. Closing switch S6 activates the amplifier 402 to amplify the residue that remains on the TP of the capacitors C1-C4 for STG 2 of the device 100/200. Switch S7 is closed during a sampling phase of the CDAC 104 to zero out the amplifier 402 prior to activation of the amplifier 402.

Figure 5:
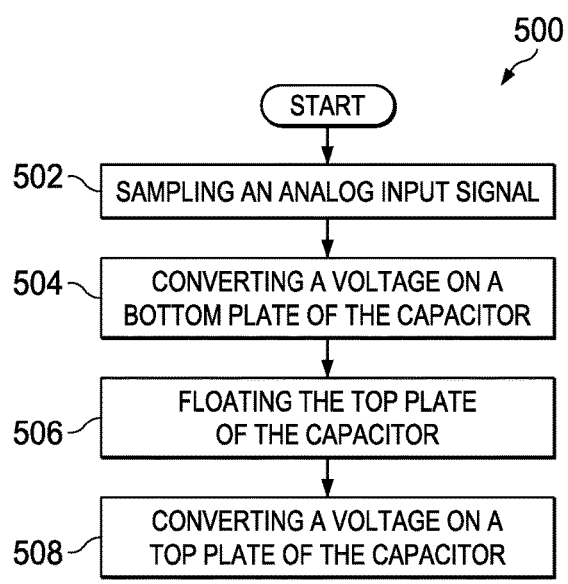
FIG. 5 illustrates an example method for obtaining additional bits from a first stage of the device shown in FIGS. 1 and 2.

In view of the foregoing structural and functional features described above, a method in accordance with various aspects of the present disclosure will be better appreciated with reference to FIG. 5. While, for purposes of simplicity of explanation, the method of FIG. 5 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure. Moreover, for simplicity of explanation, the methods of FIG. 5 can include additional functional features not discussed, with FIG. 5 being described with reference to the examples illustrated herein.

FIG. 5 illustrates an example method 500 for obtaining additional bits from a first stage, STG 1, of the device shown in FIGS. 1 and 2. At 502, an analog input signal, ANALOG INPUT, is sampled and applied to a pipelined analog-to-digital converter device 100/200 while a top plate, TP, of a capacitor 112 of a capacitive digital-to-analog converter 104 is grounded.

At 504, a voltage on a bottom plate, BP, of the capacitor 112 is converted into a first digital representation, wherein the first digital representation represents course bits produced by STG 1 of the pipelined analog-to-digital converter 100/200. The BP ADC 106/BP flash 208 converts the voltage that is held on the bottom plate BP of the capacitor 112 into a digital representation of that voltage.

The TP of the capacitor 112 is floated at 506. For example, switching a switch between the TP of the capacitor 112 and ground disconnects the TP of the capacitor 112 from ground. Floating the TP of the capacitor 112 results in the sampled signal being held for processing.

At 508, a voltage on the TP of the capacitor 112 is converted into a second digital representation, wherein the second digital representation represents fine bits produced by STG 1 of the pipelined analog-to-digital converter 100/200. The TP ADC 108/TP flash 208 converts the voltage that is held on the top plate TP of the capacitor 112 into a digital representation of that voltage.

Thereafter, after a sample is fully converted into a digital representation of the input signal ANALOG INPUT, the TP of the capacitor 112 is re-connected to ground by switching the switch between the TP of the capacitor 112 and ground to re-connect the TP of the capacitor 112 to ground. The method 500 is repeated to convert another sample into another digital representation of the input signal ANALOG INPUT.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

The invention claimed is:

1. A pipelined analog-to-digital converter device, comprising:
a first stage comprising:
a capacitive digital-to-analog converter including a capacitor comprised of a top plate and a bottom plate, the capacitive digital-to-analog converter sampling an analog input signal applied to the pipelined analog-to-digital converter device on the bottom plate of the capacitor while the top plate of the capacitor is grounded, holding the sampled analog input while the top plate is floated, and outputting a residue voltage;
a first analog-to-digital converter coupled to the bottom plate of the capacitor, the first analog-to-digital converter producing a first digital representation of voltage on the bottom plate of the capacitor while the capacitor is grounded, wherein the first digital representation represents course bits produced by the first stage of the pipelined analog-to-digital converter device.

2. The pipelined analog-to-digital converter device according to claim 1, further comprising:
a second stage comprising a second analog-to-digital converter coupled to an analog output of the capacitive digital-to-analog converter, the second analog-to-digital converter producing a second digital representation of the residue voltage from the first stage; and
a digital summer to sum the first and second digital representations into a composite digital representation of the analog signal applied to the pipelined analog-to-digital converter device.

3. The pipelined analog-to-digital converter device according to claim 2, further comprising an amplifier to amplify the residue voltage and to output the amplified residue voltage to the second stage.

4. The pipelined analog-to-digital converter device according to claim 2, further comprising a feedback loop to feed back an offset-error correction signal from an offset corrector to the first analog-to-digital converter.

5. The pipelined analog-to-digital converter device according to claim 1, wherein the first and second analog-to-digital converters are flash analog-to-digital converters.

6. A pipelined analog-to-digital converter device, comprising:
a first stage comprising:
a capacitive digital-to-analog converter including a capacitor comprised of a top plate and a bottom plate, the capacitive digital-to-analog converter sampling an analog input signal applied to the pipelined analog-to-digital converter device on the bottom plate of the capacitor while the top plate of the capacitor is grounded, holding the sampled analog input while the top plate is floated, and outputting a residue voltage; and
a first analog-to-digital converter coupled to the top plate of the capacitor, the first analog-to-digital converter producing a first digital representation of voltage on the top plate of the capacitor after the top plate is floated, wherein the first digital representation represents fine bits produced by the first stage of the pipelined analog-to-digital converter device.

7. The pipelined analog-to-digital converter device according to claim 3, further comprising:
a second stage comprising a second analog-to-digital converter coupled to an analog output of the capacitive digital-to-analog converter, the second analog-to-digital converter producing a second digital representation of the residue voltage from the first stage; and
a digital summer to sum the first and second digital representations into a composite digital representation of the analog signal applied to the pipelined analog-to-digital converter device.

8. The pipelined analog-to-digital converter device according to claim 7, further comprising an amplifier to amplify the residue voltage and to output the amplified residue voltage to the second stage.

9. The pipelined analog-to-digital converter device according to claim 7, further comprising a feedback loop to feed back an offset-error correction signal from an offset corrector to the first analog-to-digital converter.

10. The pipelined analog-to-digital converter device according to claim 3, wherein the first and second analog-to-digital converters are flash analog-to-digital converters.

* * * * *